United States Patent
Tozburun et al.

(10) Patent No.: US 12,212,114 B2
(45) Date of Patent: Jan. 28, 2025

(54) METHOD AND SYSTEM USING OPTICAL PHASE MODULATION AND OPTICAL PHASE DEMODULATION AND SPECTRAL FILTERING TO GENERATE AN OPTICAL PULSE TRAIN

(71) Applicant: IZMIR BIYOTIP VE GENOM MERKEZI, Balcova/Izmir (TR)

(72) Inventors: Serhat Tozburun, Balcova/Izmir (TR); Ibrahim Akkaya, Balcova/Izmir (TR)

(73) Assignee: IZMIR BIYOTIP VE GENOM MERKEZI, Balcova/Izmir (TR)

( * ) Notice: Subject to any disclaimer, the term of this patent is extended or adjusted under 35 U.S.C. 154(b) by 219 days.

(21) Appl. No.: 17/793,505

(22) PCT Filed: Jan. 28, 2021

(86) PCT No.: PCT/TR2021/050083
§ 371 (c)(1),
(2) Date: Jul. 18, 2022

(87) PCT Pub. No.: WO2021/158195
PCT Pub. Date: Aug. 12, 2021

(65) Prior Publication Data
US 2023/0075147 A1  Mar. 9, 2023

(30) Foreign Application Priority Data

Feb. 3, 2020  (TR) .................................. 2020/01594
Sep. 2, 2020  (TR) .................................. 2020/13928

(51) Int. Cl.
*H01S 3/107*  (2006.01)
*H01S 3/083*  (2006.01)
(Continued)

(52) U.S. Cl.
CPC .............. *H01S 3/107* (2013.01); *H01S 3/083* (2013.01); *H01S 3/0912* (2013.01);
(Continued)

(58) Field of Classification Search
CPC ...... H01S 5/0085; H01S 5/1109; H01S 3/083; H01S 3/10053; H01S 3/107
See application file for complete search history.

(56) References Cited

U.S. PATENT DOCUMENTS

2009/0086773 A1*  4/2009  Murison ............. H01S 3/06754
                                                            372/20
2009/0323735 A1* 12/2009  Kuksenkov ............. H01S 3/067
                                                            385/124
(Continued)

OTHER PUBLICATIONS

Yu, "Multi-Channel High Speed Optical Pulse Train Generation Based on Phase Modulation at Half Frequency," 2007, Conference on Lasers and Electro-Optics (CLEO), Baltimore, MD, USA, 2007, pp. 1-2, doi: 10.1109/CLEO.2007.4452573. (Year: 2007).*

*Primary Examiner* — Michael Carter
(74) *Attorney, Agent, or Firm* — Notaro, Michalos & Zaccaria P.C.

(57) ABSTRACT

A method of generating an optical pulse train using spectral extension by optical phase modulation, spectral narrowing by optical phase demodulation, and narrow linewidth optical filtering is disclosed. It is also described that the wavelength selection of light using a chromatic dispersion element between the optical phase modulator can enrich the method. Systems include an in-line optical setup and a ring-type laser cavity for mode-locked laser outputs. The duration with which the electrical signals driving the modulators are opposed determines the line width of the optical pulses, and the opposite repetition of the electrical signals defines the rate of repetition of an optical pulse train generated. Four different arrangements of electrical signals in the time (Continued)

domain or phase domain make it possible to control the generation of optical pulses and the wavelength selection of the light. (i) A signal arrangement comprising sinusoidal electrical signals with a slight frequency difference. (ii) A signal arrangement comprising a phase-shift between electrical signals. (iii) A signal arrangement comprising a phase-shift between electrical signals depending on the amplitude of the bits. (iv) A signal arrangement comprising random electric waves that repeat themselves over a predefined period to allow the insertion of controllable time delays between each other.

14 Claims, 20 Drawing Sheets

(51) Int. Cl.
  *H01S 3/091* (2006.01)
  *H01S 3/0941* (2006.01)
  *H01S 3/10* (2006.01)
  *H01S 3/106* (2006.01)
  *H01S 3/1109* (2023.01)

(52) U.S. Cl.
  CPC ........ *H01S 3/0941* (2013.01); *H01S 3/10053* (2013.01); *H01S 3/1062* (2013.01); *H01S 3/1109* (2013.01)

(56) References Cited

U.S. PATENT DOCUMENTS

| | | | |
|---|---|---|---|
| 2010/0002281 A1* | 1/2010 | McDonald | H01S 3/06754 359/240 |
| 2011/0032605 A1* | 2/2011 | Kliner | H01S 3/2333 359/344 |
| 2011/0063711 A1 | 3/2011 | Kanter | |

\* cited by examiner

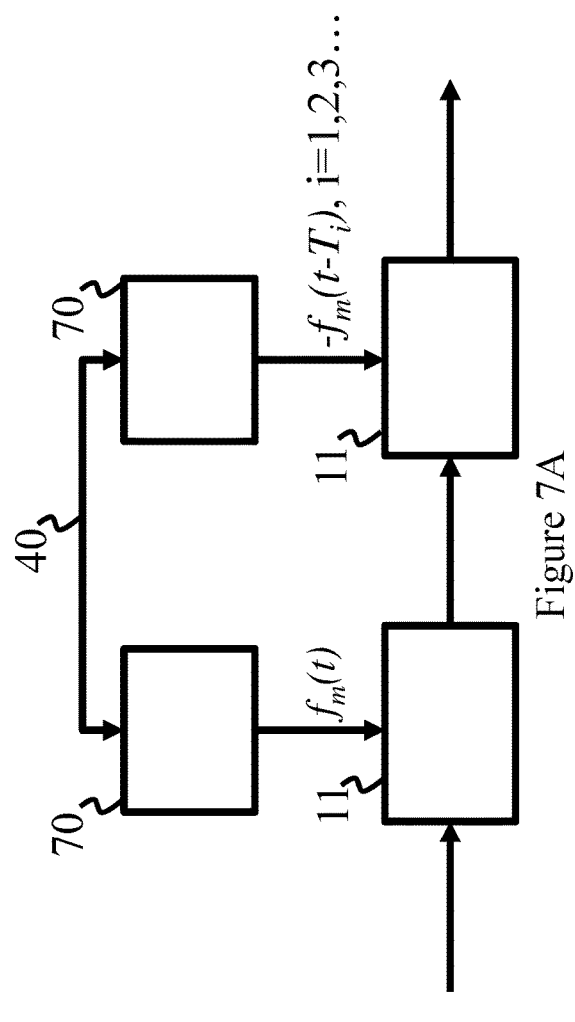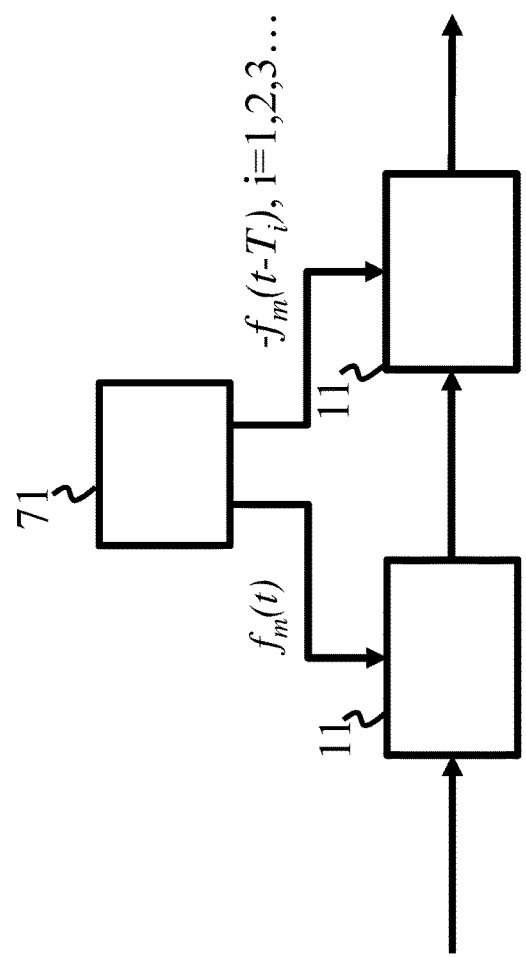

METHOD AND SYSTEM USING OPTICAL PHASE MODULATION AND OPTICAL PHASE DEMODULATION AND SPECTRAL FILTERING TO GENERATE AN OPTICAL PULSE TRAIN

TECHNICAL FIELD

The present invention is related to methods and systems that can be configured to generate optical pulses for use in optical imaging, optical material processing, optical measurements, medical diagnosis and therapy applications, telecommunications, and more particularly, active mode-locked laser technology.

BACKGROUND ART

An optical pulse refers to the state of electromagnetic radiation that occurs and fades rapidly in a relatively narrow time interval. Various methods provide optical pulses with different line-widths (for example, down to femtosecond ($10^{-15}$ s) range and repetition rate [1,2]. Featured methods include gain switching, active and passive Q-switching, laser cavity evacuation, active and passive mode-locking [1-3].

Mode-locking technique is a widely used method in laser technology and particularly in stable optical pulse generation. For example, in the passive mode-locking technique, optical pulses are produced using optical absorbers such as absorbent dyes (e.g., Diethyl-Oxa-Dicarbocyanine Iodide), specialized crystals, or semiconductor materials (e.g., GaAs or AlAs). This technique can produce relatively short optical pulses based on rapid modulation of cavity losses in the case of a saturable absorber with a sufficiently short recovery time. For example, femtosecond optical pulses can be generated [2]. Yet, the line widths and repetition rates of the generated optical pulses are tightly dependent on the optical properties of the absorber used. These properties cannot be actively controlled by any external means, and therefore, only optical pulses with the same linewidth and repetition rate can be guaranteed.

On the other hand, the active mode-locking technique is a method based on a periodic modulation of laser resonator losses or round-trip phase shift in the laser cavity [2,3]. In this technique, the modulation is synchronized with the fundamental frequency and harmonics of the cavity round trip to generate short optical pulses. Optical components (such as an acoustic-optical modulator [4], an electro-optic modulator [5], a Mach-Zehnder integrated optical modulator [6-8]) can achieve active mode-locking. Besides, an intensity modulator can be utilized along with a phase modulator to provide modulation resulting in mode-locking. An intensity modulator and a phase modulator can be utilized together to provide modulation resulting in mode-locking [5,9]. Moreover, active mode-locking can be achieved using a phase modulator and chromatic scattering optical element together [10,11]. In such designs, optical pulse generation is independent of the wavelength selection of the laser emission. For example, the laser wavelength can be selected by various arrangements, particularly by spectral filtering [12] or chromatic dispersion [13] or changing the laser cavity length via mechanical force [14]. In optical pulse generating systems using electro-optic intensity modulators, the modulator requires a bias controller addition to the RF signal generator, and in this respect, fine-tuning of the DC threshold is critical. However, unexpected oscillations in the cavity may occur due to temperature-change-induced optical polarization instability limiting stable optical pulse generation [11] In systems using fiber optics as chromatic dispersion elements, it causes high optical losses due to the very long cable length and nonlinear distorting effects to occur in the laser cavity, which may cause phase and amplitude mismatches depending on the optical wavelength [15,16].

Reviewing the existing systems: the core purpose is to use an optical phase modulator and optical filters to minimize back reflection from photon leakage and thus to reduce background noise; to produce optical pulses with high rate and short linewidth without increasing the modulation index; improving the spectrum of a mode-locked laser through an optical filter due to temperature or ambient conditions, which reduces its operational stability; production of optical pulses in return-to-zero format and duty cycle can change; to provide a compact optical pulse amplitude stabilizer that eliminates amplitude imbalance in optical pulses and pulses at a high repetition rate in a mode-locked fiber ring laser as a rational harmonic; to characterize the phase profiles of pulses in optical pulses by performing optical phase modulation and related optical spectrum analysis; to provide the relative phase shift applied to the electrical signal driving the optical phase modulator with an algorithm-dependent feedback or control signal.

A review of existing systems should note that the driving method of optical phase modulators has electrical signals with distance-induced time delay, and only in-line optical configuration can operate in a stable regime. A review of existing systems should note regarding environmental effects, such as temperature, also notes that an Erbium-doped active optical fiber can be suitable for laser emission.

Besides, a review of the existing systems regarding components used for optical pulse should report that the system consists of an optical phase modulator, an optical isolator, and a passive optical spectrum filter (e.g., fused Fabry-Perot etalon). However, the free-spectra range of the fiber Fabry-Perot etalon must be equal or integer multiples of the laser cavity frequency.

It should be noted that the system uses an electro-optic intensity modulator or an electro-optic phase modulator for generating ultra-short optical pulses. Some have an electro-optic phase modulator used to analyze the optical pulse.

Still reviewing the existing systems: it should be noted that there is no selection of light oscillating in the cavity using optical phase modulation and optical phase demodulation process; optical pulses in the sinusoidal waveform with a variable return-to-zero format require external components or tools; simplifying accurate characterization of an optical pulse including determining the phase; the optical pulses generated are valid for the oscillation of a single laser wavelength.

SUMMARY OF INVENTION

The present invention relates to in-line optical setups, laser cavities, and electrical signal arrangements driving electro-optic components configured to generate an optical pulse train and wavelength selection of light. Specifically, the present invention relates to a method and apparatus using optical phase modulation, optical phase demodulation, spectral filtering, and electrical signal arrangements to generate optical pulses to overcome the aforementioned drawbacks and bring new advantages to the relevant technical field.

In-line optical setups or laser cavities may include at least two electro-optic phase modulators and at least one narrow linewidth optical filter. Arrangements of electrical signals in the time-domain or phase-domain to drive the modulators make it possible to control the pulse-width and repetition rate of the optical pulses and the wavelength selection of light. Creating a slight frequency difference between the electrical signals can provide such a signal arrangement. Producing a rapid phase-shift between electrical signals with a phase shifter installed at the output of one of the signal generators can also provide the signal arrangement. Another signal arrangement can be achieved by a rapid phase-shift between two electrical signals as a function of the amplitude of bits using an analog or digital frequency mixer. Another arrangement of electrical signals may be opposing random waveforms that repeat themselves over a predefined period and allow the insertion of controllable time delays between each other. For example, the actions of the first, second, third, or fourth electrical signal arrangements to drive electro-optic phase modulators can produce relative time advances or delays between electrical signals, and hence rapid phase shifts in time. Therefore, the linewidth and repetition rates of optical pulses can be correlated and controlled with phase shifts resulting from first, second, third, or fourth electrical signal arrangements.

The advantages and innovations of the present invention over the state of the art can be summarized as follows: the proposed optical pulse generation method can be applied to both an in-line optical system and a ring-cavity laser system. The systems use semiconductor optical amplifier technology as a gain medium pumped with electrical current. Actively mode-locked laser configuration can provide a long coherence length laser output using an optical filter with a very narrow spectral linewidth. The invention proposes 180° (in radians) phase-shift induced time-delayed electrical signals (i.e., opposite electrical signals/waveforms) for driving electro-optic phase modulators. The various electrical signal arrangements of the present invention (providing opposite signals or 180° (in radians) phase shifted) drive active optical components, such as electro-optic phase modulators, to generate an optical pulse train. In the case of an optical frequency comb source, the addition of dispersion-induced time delay (or phase shift) between optical frequencies to the opposing random waveforms operating phase modulators ensures the wavelength selection of light.

DESCRIPTION OF DRAWINGS

The present invention discloses a method and apparatus that uses optical phase modulation, optical phase demodulation, spectral optical filtering, and electrical signal arrangements to generate an optical pulse and select light wavelength. $f_m(t)$ represents the electrical signal or the RF signal for optical phase modulation. $-f_m(t)$ represents the opposite electrical signal or the opposite RF signal for optical phase demodulation.

FIG. 7A: Block diagram of a configuration of phase-locked arbitrary waveform generators, providing yet another signal arrangement to drive optical phase modulators associated with the system of FIG. 2 or FIG. 3.

FIG. 7B: Block diagram of a configuration of a programmable bit pattern generator with two outputs providing another signal arrangement to drive optical phase modulators associated with the system of FIG. 2 or FIG. 3.

DESCRIPTION OF EMBODIMENTS

FIG. 1 presents exemplary embodiments for optical phase modulation and optical phase demodulation processes and examples showing spectral extension and spectral narrowing. Optical phase demodulation defines the process that reverses the phase modulation applied by inverse (opposite) electrical signals relative to the signals driving the first modulator and hence, the optical spectrum extension (broadening).

Figure 1A:
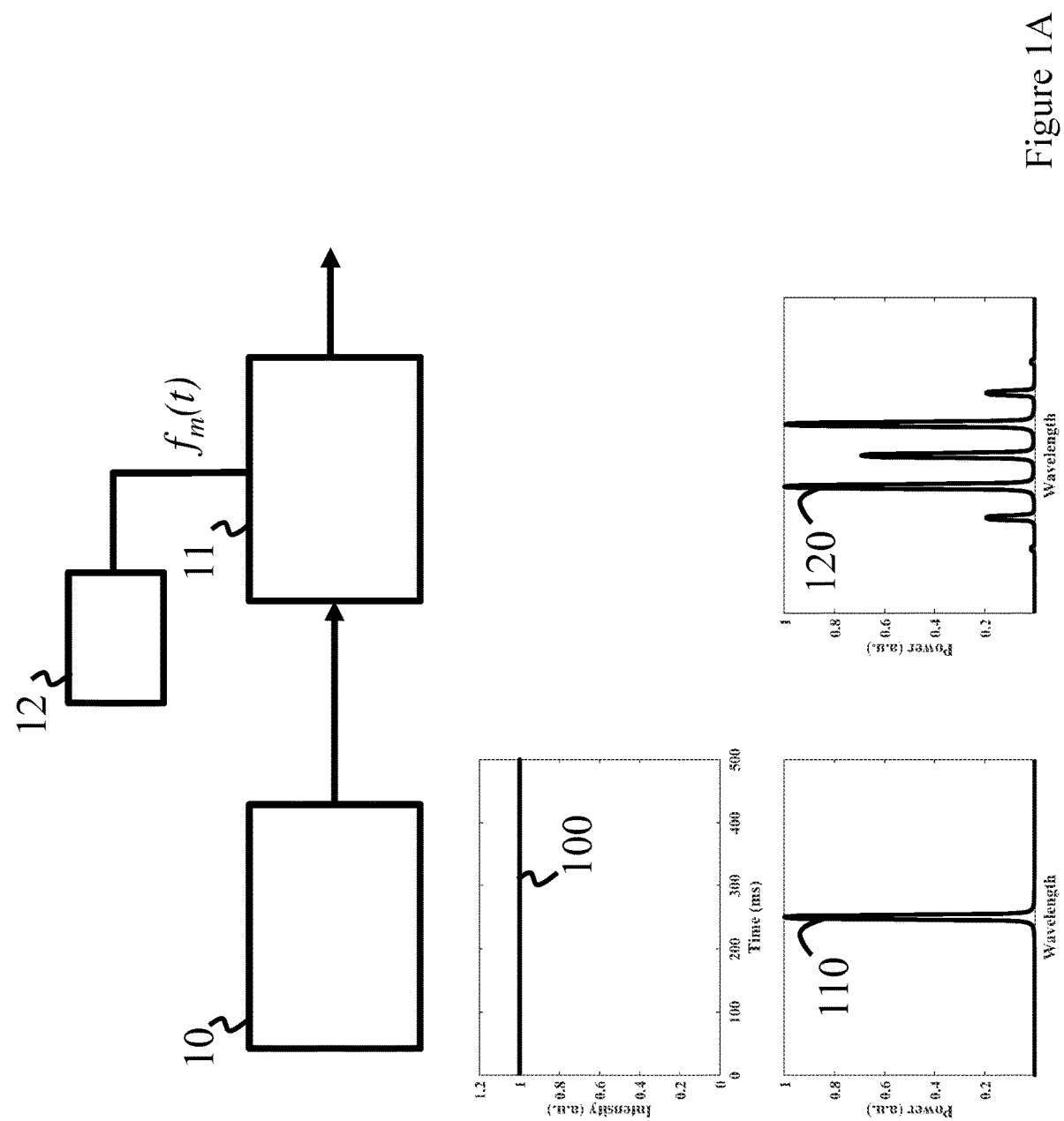
FIG. 1A: Diagram of exemplary optical phase modulation and representative graphs in the time domain and the spectrum domain, respectively.

FIG. 1A presents an exemplary embodiment and a representative spectral result producing spectral extension by optical phase modulation. The exemplary embodiment includes a narrowband light source 10, an electro-optic phase modulator 11, and an electrical signal generator 12. The continuous wave 100 and narrowband laser beam 110 generated from the source 10 travels through an electro-optic phase modulator 11. The modulator 11 forms side optical bands in multiples of the electrical signal frequency around the central optical frequency. Hence, a narrow optical band 110 with phase modulation undergoes spectral widening, i.e., spectral expansion 120. The number of sidebands calculated by Bessel functions using modulation index (modulation depth) and modulation frequency (i.e., frequency of electrical signals) determines the phase modulation-induced spectral expansion. The voltage applied to the modulators is directly proportional to the modulation index, and as it increases, the number of sidebands also increases.

Figure 1B:
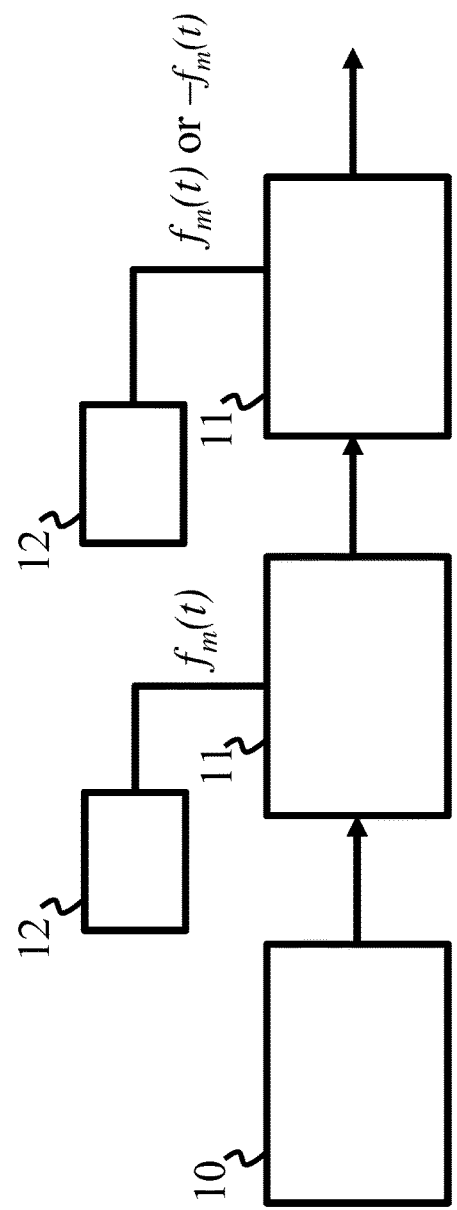
FIG. 1B: Diagram of exemplary optical phase modulation or demodulation and representative graphs in the spectrum domain, respectively.
Figure 1B:
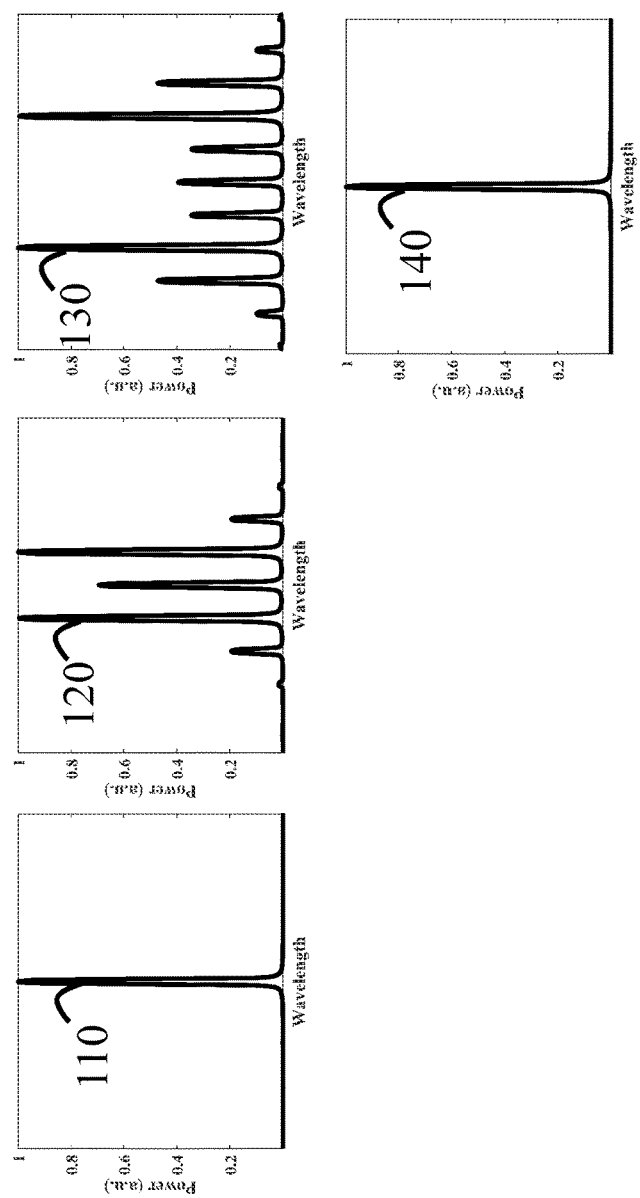

For better understanding, FIG. 1B shows an exemplary embodiment of the phenomenon according to the present disclosure for modulation-modulation or modulation-demodulation. The exemplary embodiment includes a narrowband light source 10, two electro-optic phase modulators 11 with similar technical characteristics and two electrical signal generators 12 with similar technical specs. The continuous-wave 100 and narrowband laser beam 110 transmitted through the laser source undergo spectral broadening (extension) 120 in the first electro-optic phase modulator 11. With the second electro-optic phase modulator, the broadened optical band 120 is subject to either broaden further in the spectral domain 130, i.e., second phase modulation, or undergo spectral narrowing, which returns to the original band 140, i.e., phase demodulation.

The second phase modulation can be applied to the laser beam with the same electrical signal inducing the first modulation, resulting in a spectral broadening enhancing effect. In the other case, the opposite (inverse) electrical signal driving another modulator reverses the first phase modulation, i.e., phase demodulation.

Figure 1C:
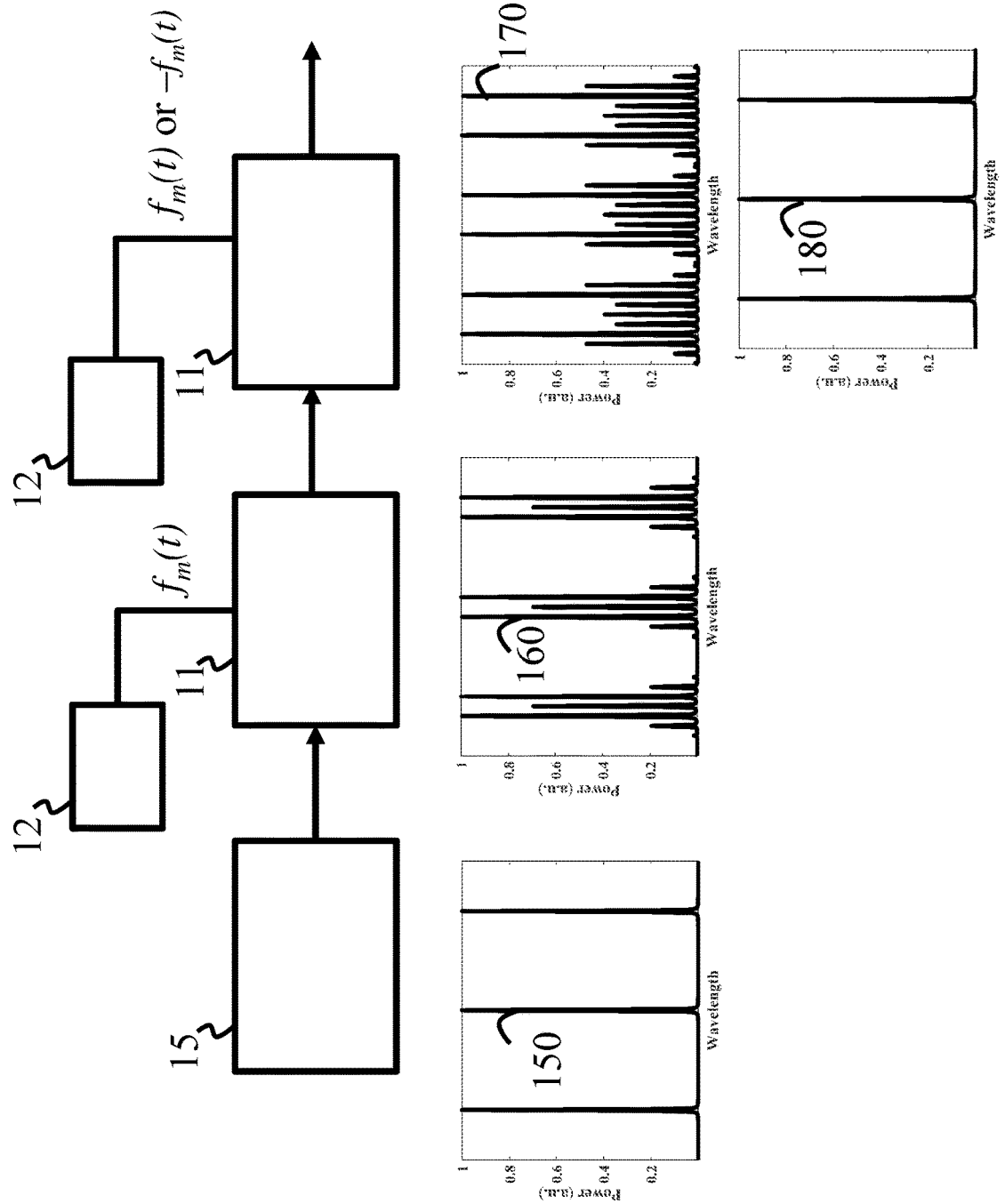
FIG. 1C: Diagram of exemplary optical phase modulation or demodulation applied to optical frequency comb and representative graphs in the spectrum domain, respectively.

FIG. 1C shows a representative embodiment of the present disclosure for optical phase modulation and optical phase demodulation of an optical frequency comb. This exemplary embodiment also includes two electro-optic phase modulators 11 with similar technical characteristics and two electrical signal generators 12 with similar technical specifications. Alternatively, narrow linewidth optical frequencies 150 generated in the laser source 15 are transmitted to the first electro-optic phase modulator 11. All optical frequencies undergo uniform phase modulation and spectral broadening 160.

Similarly, depending on the electrical signals driving the modulators, all optical frequencies experience the second modulation again spectrally expand 170 or, depending on the opposite/inverse amplitude, all optical frequencies return to their original spectral state 180 by demodulation. Similarly, depending on the electrical signals driving the modulators, all optical frequencies undergo the second modulation for spectral broadening 170, or all optical frequencies return to their original spectral state 180 by phase demodulation (re-narrowing).

The embodiments of the present invention based on the modulation and demodulation processes described in FIG. 1 are detailed for the following in-line optical setups, laser cavities, and electrical signal arrangements.

Figure 2A:
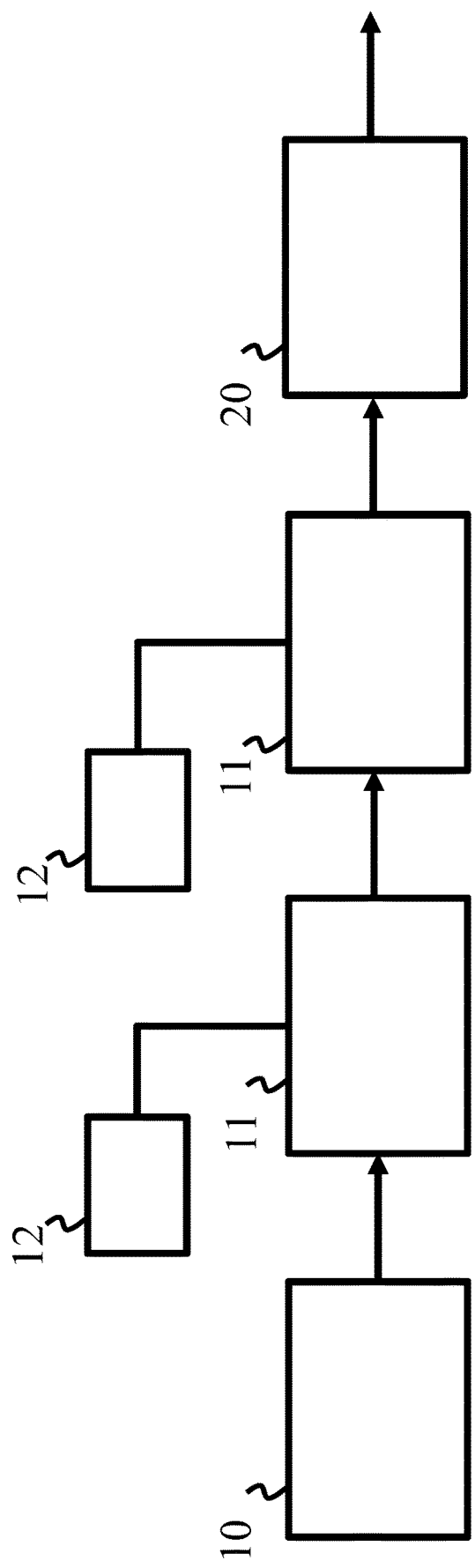
FIG. 2A: Block diagram of a system with in-line optics according to an exemplary embodiment of the present disclosure for optical pulse generation.

FIG. 2A shows an exemplary embodiment of the in-line optical setup configured to generate optical pulses, according to an exemplary embodiment of the present invention. The exemplary embodiment includes a narrowband light source 10, two electro-optic phase modulators 11 with similar technical characteristics connected in series, and a narrow linewidth optical filter 20. Two electrical signal generators 12 with similar technical specifications drive modulators.

Optical pulse generation for the exemplary embodiment can be summarized as follows: a narrowband light source 10 produces the narrow linewidth continuous-wave light. The light is emitted into the first electro-optic phase modulator 11 and subjected to spectral broadening as a function of the applied phase modulation. Returning to FIG. 1B, the second modulator can spectrally broaden the optical band a second time (in the case of the same electrical signals) or apply spectral re-narrowing to restore its original state in the spectral domain (in the case of opposite electrical signals).

A narrow linewidth optical filter 20, which undertakes passive opening and closing functions in optical pulse generation, is connected in series to the phase modulators 11. It has optical transmission frequencies matching the frequency of the radiation produced by the narrowband light source 10. Thus, the broadening and then re-narrowing light can pass through the transmission wavelength (i.e., optical frequency) of the optical filter 20 with high efficiency (>99%).

On the other hand, the light that experiences spectral broadening twice (i.e., re-broadening) is absorbed by the spectral optical filter 20 since it does not overlap with the transmission wavelength. In other words, the spectral optical filter 20 passes or absorbs the light, depending on the spectral broadening of spectral narrowing of the optical band propagated from the source 10. Thus, time-modulation of the opposite/inverse amplitude relationship between signal generators 12 driving the first and second electro-optic phase modulators 11 can yield an optical pulse train.

The narrowband light source 10 used in the exemplary embodiment shown in FIG. 2A can be a monolithic diode laser with an internal grating, a distributed feedback laser diode, or a distributed Bragg reflector laser. Alternatively, or additionally, a continuous-wave broadband semiconductor laser source with an external optical grating can be employed in this embodiment.

Figure 2B:
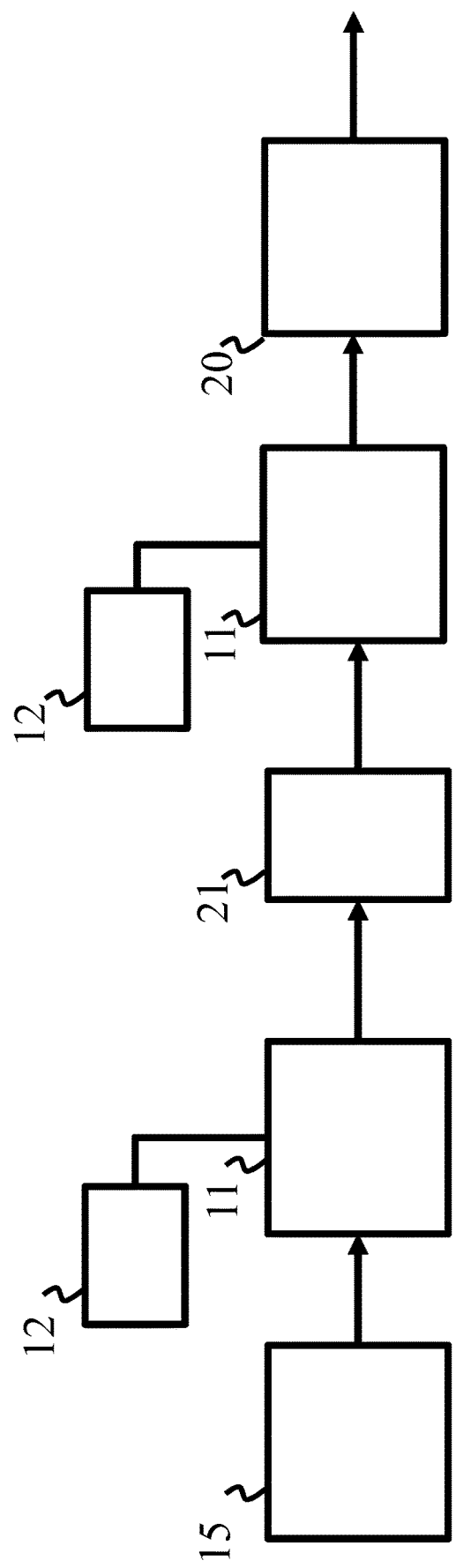
FIG. 2B: Block diagram of another system with in-line optics according to a further exemplary embodiment of the present disclosure for optical pulse generation, including wavelength selection of light.

FIG. 2B presents an exemplary embodiment of the in-line optical setup configured to generate optical pulses and select wavelengths. The exemplary embodiment includes an optical frequency comb source 15, two electro-optic phase modulators 11 with similar technical characteristics, two electrical signal generators 12 with similar specifications, an optical element providing time delay, and a narrow linewidth optical filter 20. An optical element may be a chromatic dispersion component 21 for providing time delay and/or phase delay between optical frequencies.

The working principle of the embodiment can be summarized as follows: all optical frequencies generated from the source 15 undergo spectral extension (broadening) in the first modulator 11 induced by optical phase modulation. The chromatic dispersion component 21 separates the extended frequencies from each other in the time domain so that consecutive optical frequencies reach the second modulator 11 in sequential time order. In addition to the phase modulation and phase demodulation described in FIG. 2A, the signal driving the second modulator 11 is opposite to the signal driving the first modulator 11 within a certain delay corresponding to the time interval due to chromatic dispersion. Thus, the wavelength of light can be chosen depending on the successive increase in delay between electrical signals. Light of the selected wavelength passes through the optical filter 20 with high efficiency by re-narrowing the spectrum with the second phase modulation. An optical filter 20 absorbs unselected wavelengths due to the second spectral broadening (re-broadening), preventing the transmission.

Figure 3A:
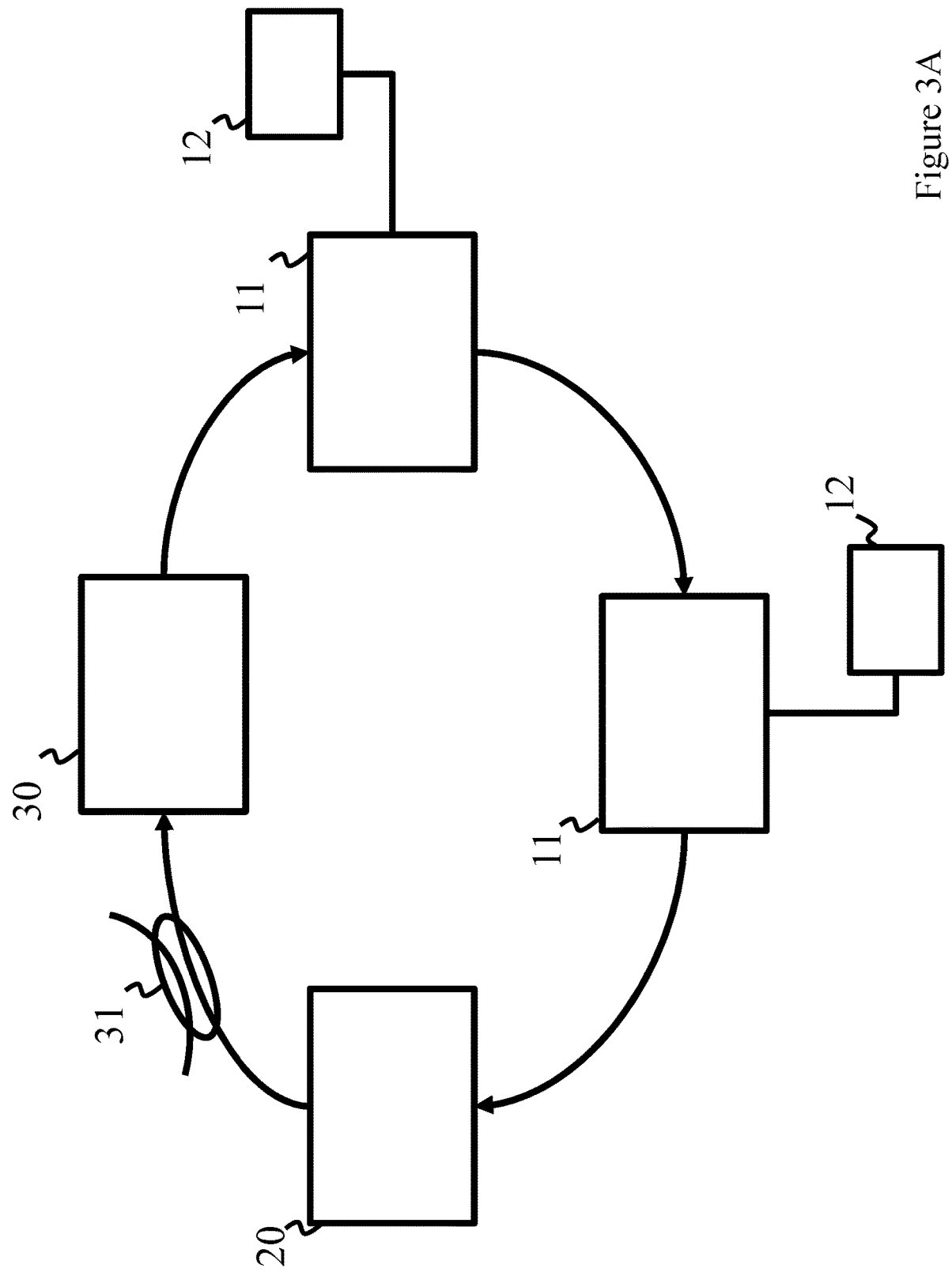
FIG. 3A: Block diagram of a ring-type laser cavity system according to an exemplary embodiment of the present disclosure for laser pulse generation.

In another exemplary embodiment of the present invention, a ring-type laser cavity can produce active mode-locked laser output. As shown in FIG. 3A, a narrowband light source 30, two similarly featured electro-optic phase modulators 11, a narrow linewidth optical filter 20, and a coupler 31 can configure the laser cavity. The working principle of the laser can be explained as follows: the first phase modulator 11 generates spectral broadening while the second phase modulator 11 spectrally narrows as long as the second signal is opposite to the first signal for a certain period. At other moments, the second modulator 11 continues to expand optical frequencies spectrally. In combination with this disclosed phenomenon and the optical filter 30 in the cavity, the laser is enabled to generate optical pulses. The repetition rate of opposite the second signal to the first signal from electrical signal generators 12 is matched with the cavity round-trip time or harmonics to achieve the active mode-locking.

Figure 3B:
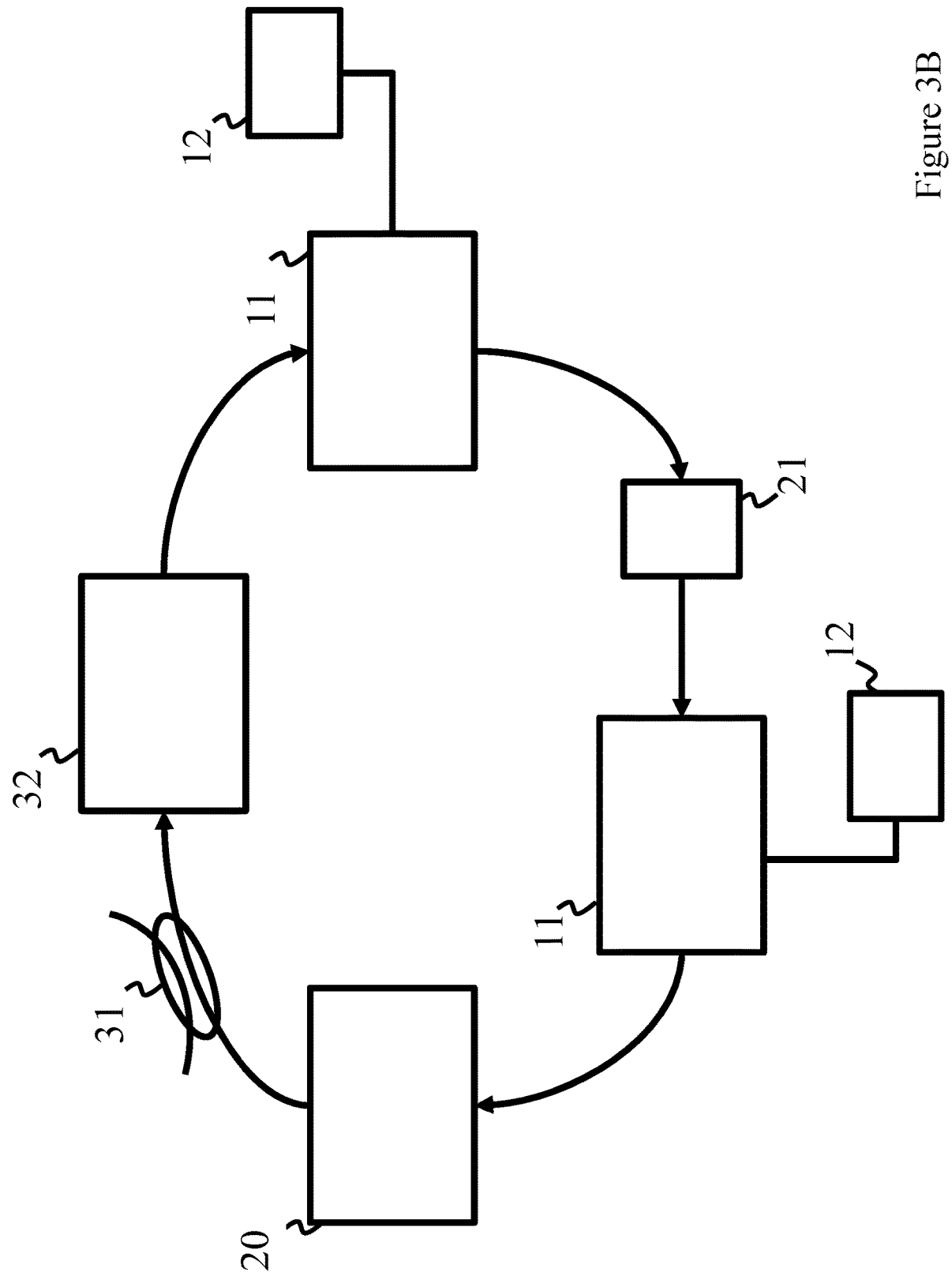
FIG. 3B: Block diagram of another ring-type laser cavity system according to a further exemplary embodiment of the present disclosure for laser pulse generation, including wavelength selection of light.

Alternatively, or additionally, as shown in FIG. 3B, another laser cavity can be configured with an optical frequency comb light source 32, two electro-optic phase modulators with similar technical specifications 11, two electrical signal generators 12 with similar technical specifications, narrow linewidth optical filter 20, a chromatic dispersion component 21, and an optical coupler 31.

The working principle of the laser can be explained as follows: the first optical phase modulator 11 generates spectral expansion to optical frequencies oscillating in the laser cavity. The intra-cavity chromatic dispersion component 21, causing phase or time delay between laser wavelengths, separates all optical frequencies in the time domain and transmits them to the second optical phase modulator 11 in sequential order. The second phase modulator 11 is driven by the electrical signal opposite the electrical signal driving the first modulator 11 within a certain delay corresponding to the time interval or multiples between optical frequencies. The delay between the opposite signals is set according to the time interval of the lasing wavelength. Thus, the selected wavelength, which is spectrally broadened and re-narrowed respectively, passes through the transmission line of an optical filter with high efficiency (>99%), while other optical frequencies are prevented from oscillation in the cavity. An optical coupler 31 obtains the laser output. The repetition rate of the second signal being opposite to the first signal for a certain period matches with the cavity round-trip time or harmonics to ensure the active mode-locking.

In all of the exemplary embodiments listed in the present disclosure, the electro-optic phase modulator 11 can be a Pockels cell type modulator, modulator on the titanium in-diffused waveguide, or a Lithium Niobate optical modulator. Electrical signal generator 12 can be analog or digital signals. Besides, electrical signal generator 12 can be an RF-signal generator, a function generator, a random bit generator, or a bit pattern generator.

The chromatic dispersion component 21 can be one or a combination of optical fiber, a chromatic dispersion compensator, a prism, or a chirped fiber Bragg grating.

The invention is on a sequential process of spectral broadening caused by phase modulation and spectral re-narrowing caused by phase demodulation. Phase modulation and phase demodulation, as explained in FIG. 1, are relative processes. The opposite (inverse amplitude) states of the electrical signals driving the modulators 11 and the time modulation of this state define the linewidth and repetition rate of the generated optical pulses. Moreover, the delay and harmonics between the opposite electrical signals determine the wavelength selection in the optical frequency comb light source configuration. In this context, methods for the arrangements of electrical signals driving electro-optic phase modulators 12 are described below.

Figure 4A:
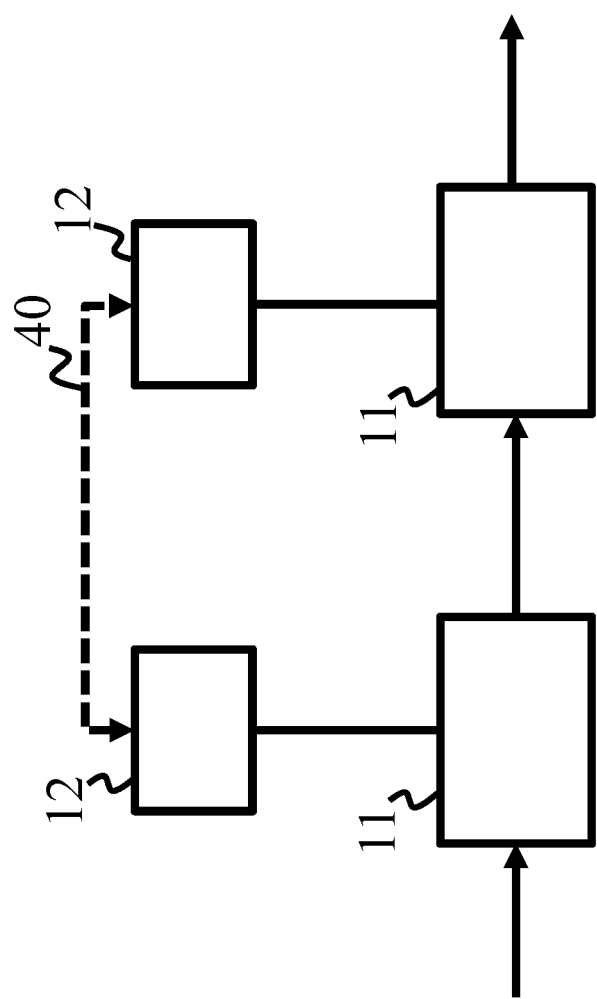
FIG. 4A: Block diagram of a configuration of phase-locked signal generators providing a signal arrangement to drive optical phase modulators associated with the system of FIG. 2 or FIG. 3.
Figure 4B:
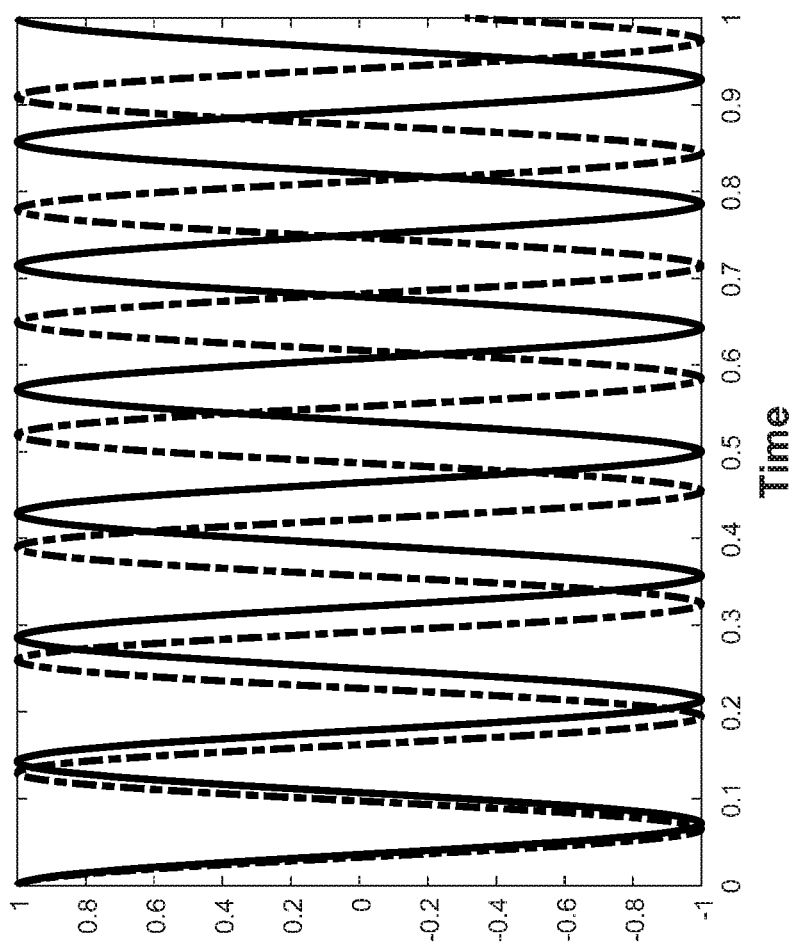
FIG. 4B: Representative amplitude-time graph illustrating the signal arrangement of two sinusoidal electrical signals with a slight frequency difference, provided by the configuration of FIG. 4A.

FIG. 4 shows an exemplary embodiment for an arrangement of electrical signals providing a slight frequency difference between the signals. As shown in FIG. 4A, electro-optic phase modulators 11 with similar technical features are driven by two electrical signal generators 12 with similar technical specifications. Both electrical signal generators 12 are connected to operate in the same time domain or the same clock signal. This coupling is phase locking, common 10 MHz clock signal, etc. It can be in any one or a combination of methods. The working principle of the method is explained as follows: opposite electrical signals/waveforms are defined, in particular, by a 180° (in radians) phase-shift. As shown in FIG. 4B, a time-dependent phase shift occurs between the sinusoidal electrical waves operating two signal generators 12 at slightly different frequencies. Thus, the phase difference between electrical waveforms is modulated from 0° to 180° to be a function of time. Once the phase difference between the two waves reaches 180°, opposite waves are obtained, and thereby phase demodulation. In other instances, second optical phase modulation and low transmission through narrow linewidth optical filter 20 are achieved. By modulating the spectral broadening and spectral narrowing in time depending on the phase shift between signals, the continuous-wave radiation generates an optical pulse array with the aid of a narrow linewidth optical filter 20. The frequency difference between two electrical signals defines the repetition rate of the optical pulse train at 50% duty cycle.

Figure 5A:
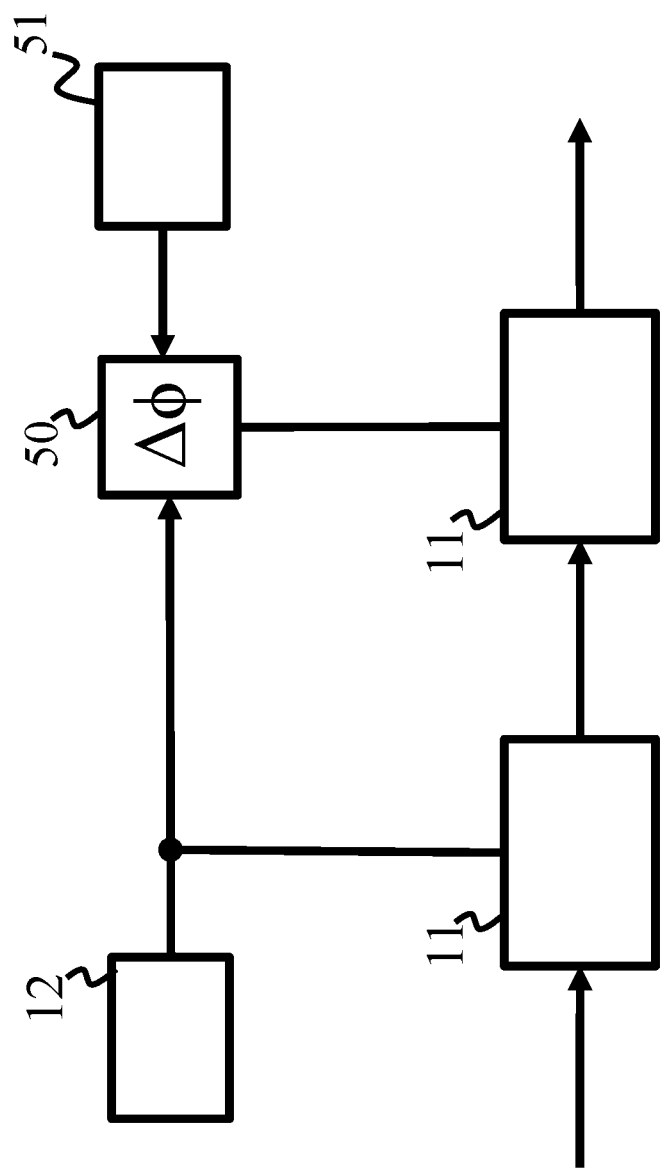
FIG. 5A: Block diagram of a configuration of a signal generator, a square wave generator, and a phase shifter, providing another signal arrangement to drive optical phase modulators associated with the system of FIG. 2 or FIG. 3.
Figure 5B:
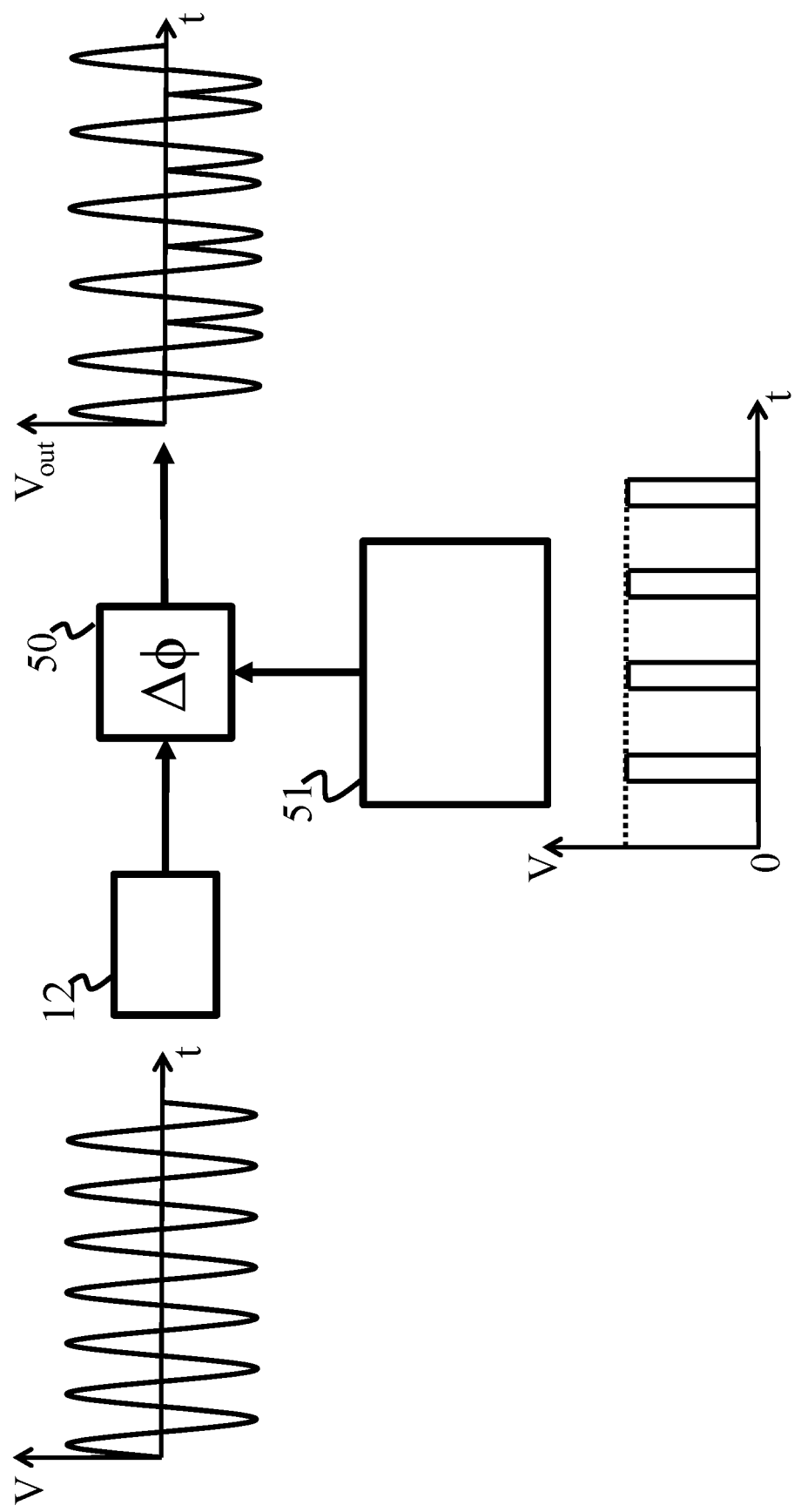
FIG. 5B: Representative diagrams illustrating a 180° phase-shift sinusoidal electrical signal, provided by the configuration of FIG. 5A.

FIG. 5 shows an exemplary embodiment for an arrangement of electrical signals to provide a phase-shift between signals. As shown in FIG. 5A, an electrical signal generator 12 drives two electro-optic phase modulators 11 with similar technical specifications. Generator 12 may, for example, be an RF signal generator. The exemplary embodiment also includes a square wave generator and an analog or digital phase shifter. The square wave generator 51 may be a bit pattern generator or a function generator. The working principle of the presented method is as follows: as shown in FIG. 5B, the sinusoidal electrical waves supplied from a generator 12 are divided into two branches. By switching the phase shifter with a square wave generator 51 through the control input, the phase difference (phase shift) between the waves divided into two branches is configured to be a function of time between 0° and 180° (in radians). The 180° phase-shift produces the opposite signal allowing optical phase demodulation relative to the first modulation. The RF signal generator 12 directly drives the first electro-optic phase modulator 11. The second electro-optic phase modulator 11 is driven by waves that undergo rapid phase-shift modulation in time with the phase shifter 50 switched by the square wave generator 51. Thus, an optical pulse train is generated based on the time variation of the phase difference between electric waves (i.e., modulation of the phase-shift in time).

Figure 6A:
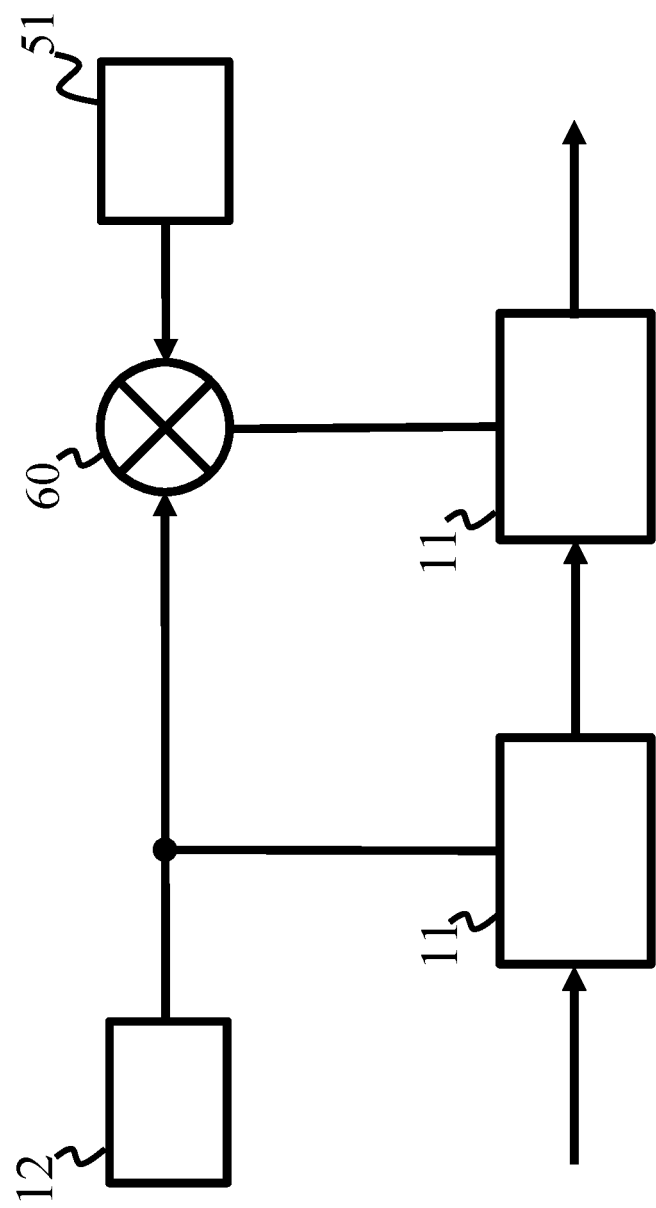
FIG. 6A: Block diagram of a configuration of a signal generator, a square wave generator, and a frequency mixer, providing still another signal arrangement to drive optical phase modulators associated with the system of FIG. 2 or FIG. 3.
Figure 6B:
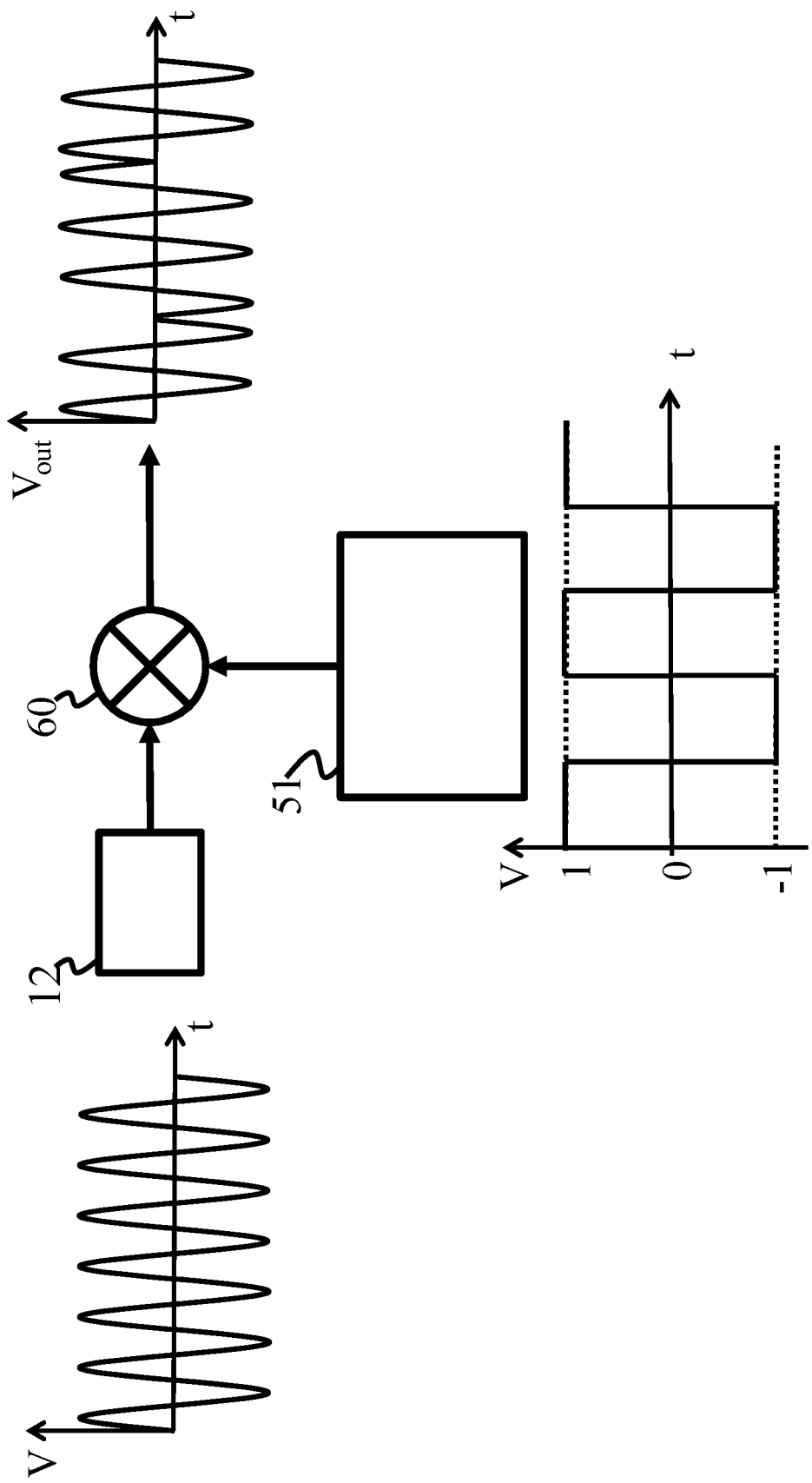
FIG. 6B: Representative diagrams illustrating a 180° phase-shift sinusoidal electrical signal, provided by the configuration of FIG. 6A.

FIG. 6 shows an exemplary embodiment for an arrangement of electrical signals to provide a phase-shift between signals as a function of bit or square wave amplitude. The embodiment includes an electrical signal generator 12, an RF frequency mixer 60, and a square wave generator 51, shown in FIG. 6A. The electric signal generator 12 drives both electro-optic phase modulators 11. As shown in FIG. 6B, the operating principle of the presented arrangement is as follows: RF sinusoidal waves transmitted from the electrical signal generator 12 are divided into two branches. The electrical signals driving the phase modulator 11 are multiplied by ±1 Volt square waves in the RF frequency mixer 60. At the +1 Volt amplitude of the square wave, RF signals exit the RF frequency mixer 60 without phase-shift. At the −1 Volt state of the square wave amplitude, the signals undergo a 180° phase-shift and have the opposite amplitude. In this way, the phase difference between the electrical signals driving the first modulator 11 and the electrical signals driving the second modulator 11 is time modulated (0° or 180°) as a function of a square wave with an amplitude of ±1 Volt, thereby generating an optical pulse train.

FIG. 7 shows an exemplary embodiment for an arrangement of electrical signals to provide opposite random waveforms that enable optical pulse generation and wavelength selection of light. FIG. 7A presents the configuration of driving electro-optic phase modulators 11 with two random-wave generators of similar technical specifications 70. Random-wave generators 70 are phase-locked to generate signals at the same time-domain and the phase-domain. FIG. 7B presents an example of the two-output programmable bit pattern generator 71 providing the same signal arrangement.

Figure 7C:
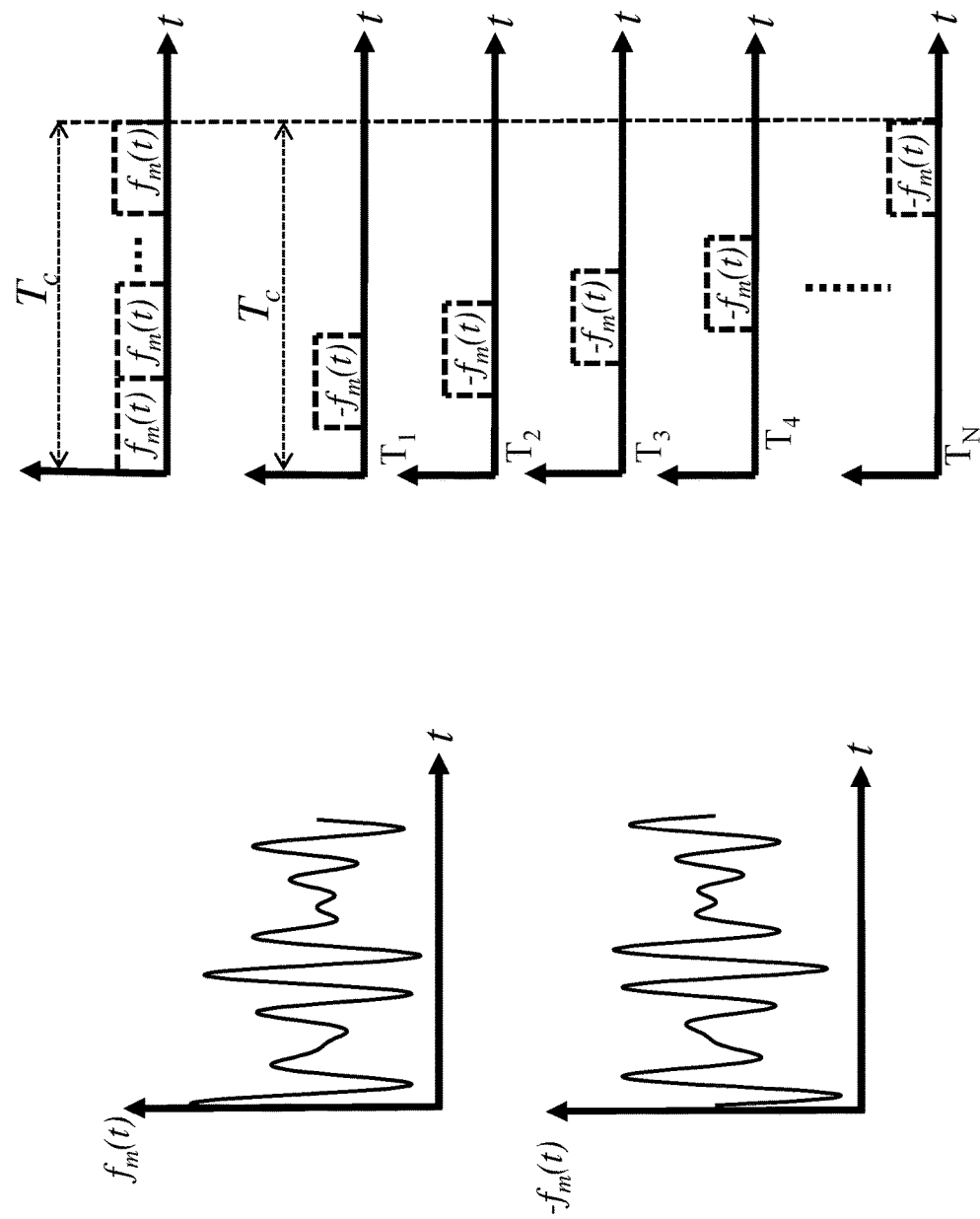
FIG. 7C: Representative graphs in the time domain showing the signal arrangement of inverse random waveforms relative to each other and the transmission order of these signals, provided by the configuration of FIG. 7A or FIG. 7B.

The arrangement presented is based on the use of random waveforms because the waveforms, repeating themselves over a predefined period, allow the insertion of controllable time delays between each other. As shown in FIG. 7C, the operation principle of the signal arrangement is as follows: the first electro-optic phase modulator 11 is driven by a random electric waveform that repeats itself without time delay. The second electro-optic phase modulator 11 is driven with the opposite form of the random electric wave. In this way, optical phase modulation and optical phase demodulation are ensured. To generate optical pulses of sequential optical frequency comb in the time domain with a chromatic dispersion element 21 inducing constant times step as described in FIG. 2B and FIG. 3B, the delayed ($T_1$, $T_2$, . . . , $T_N$) opposite random electric waves drive the second electro-optic phase modulator 11. This delay increases linearly in multiples of the time step between consecutive optical frequencies. Thus, both optical pulse generation and wavelength selection of light are performed. The time difference (i.e., time step) between the random electrical waves driving the second modulator 11 can be defined by programming the bit generator 71. Besides, the repetition of time-added contrasting random waves is performed in a cycle within the laser cavity period and its multiples, producing an actively mode-locked laser output.

Exemplary experimental setups and related results are described below, demonstrating some part of the invention is realized with an in-line optical system and laser cavity system based on two electro-optic phase modulators 11 and a fiber-based Fabry-Perot etalon 85 connected in series. These systems operated in the near-infrared spectrum.

Figure 8A:
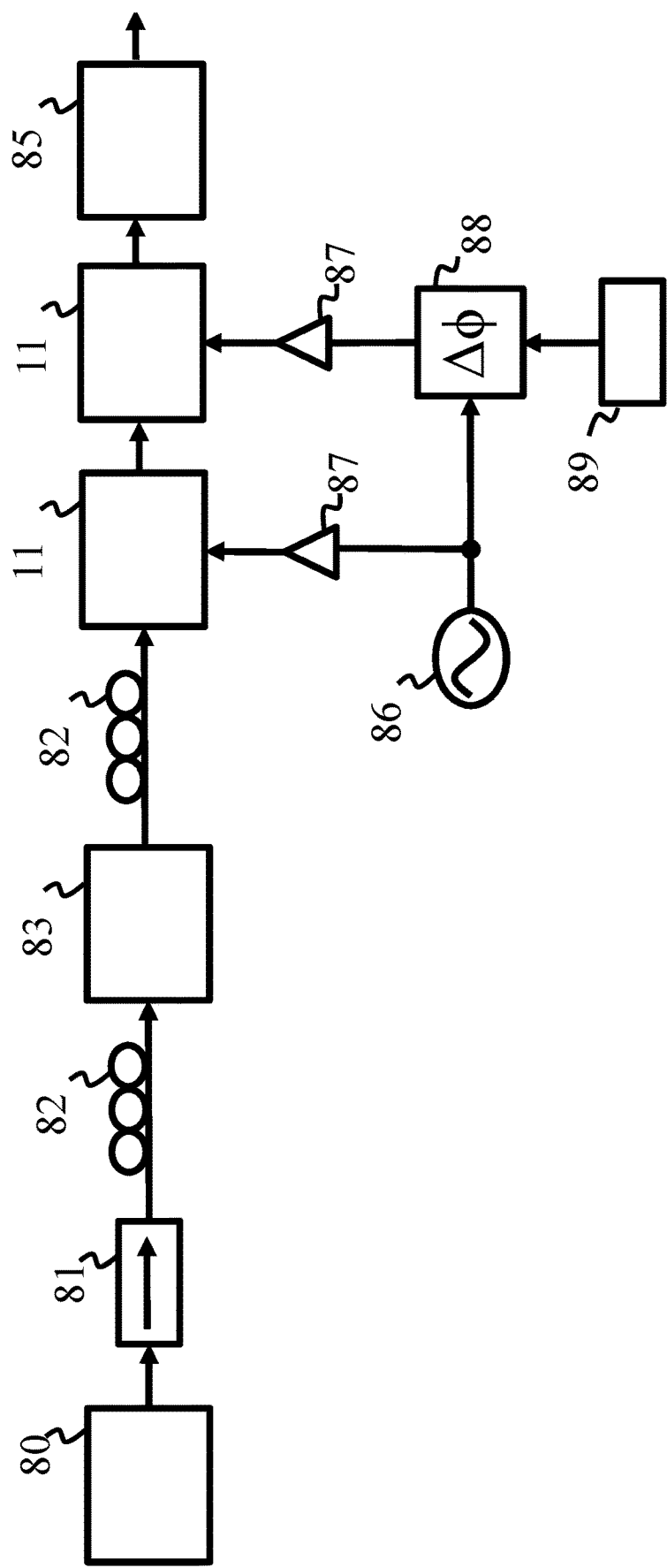
FIG. 8A: Block diagram illustrating an in-line optical system using a signal arrangement associated with the configuration of FIG. 5.

FIG. 8A demonstrates an experimental block diagram of the in-line fiber-based optical setup for optical pulse train generation of the present invention. The system employs the arrangement of the electrical signals described in FIG. 5. The system includes a semiconductor laser source 80 at the center wavelength of 1340 nm with 0.27 nm line-width, an optical insulator 81 to block the reflected beam, polarization control pedals 82 to control the polarization state of the light, 600 grooves/mm optical grating 83 for further narrowing the spectral width of light, 10-GHz $LiNbO_3$ electro-optic phase modulators 11, and a fiber-based Fabry-Perot etalon filter 85 with a fineness of 500 and 200 GHz free spectral range.

Figure 8B:
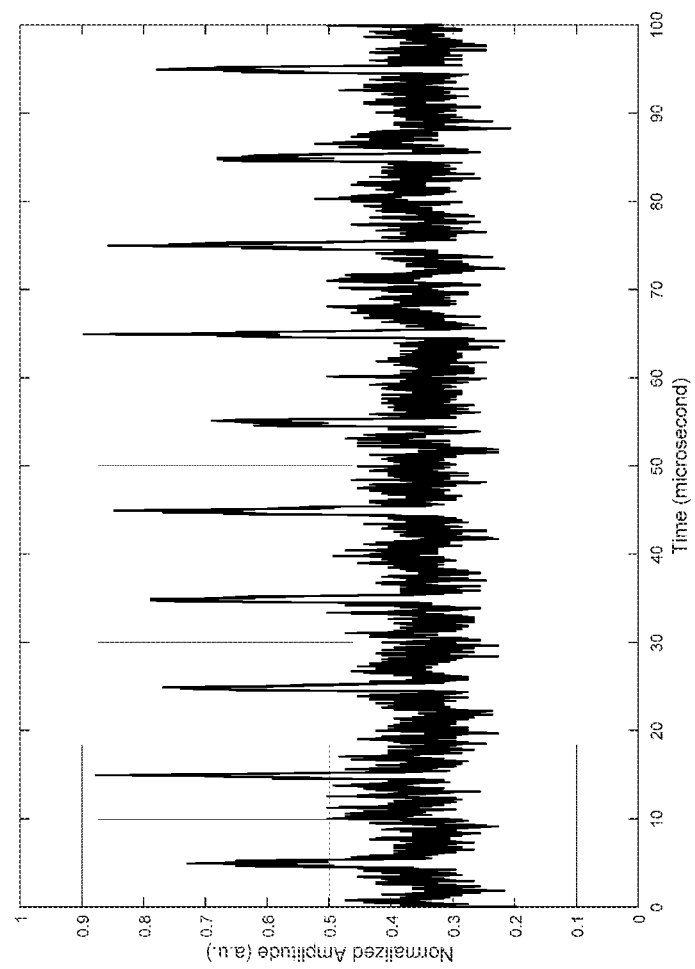
FIG. 8B: A Graph illustrating representative measured laser outputs of the exemplary ring-cavity laser in the time domain.
Figure 8C:
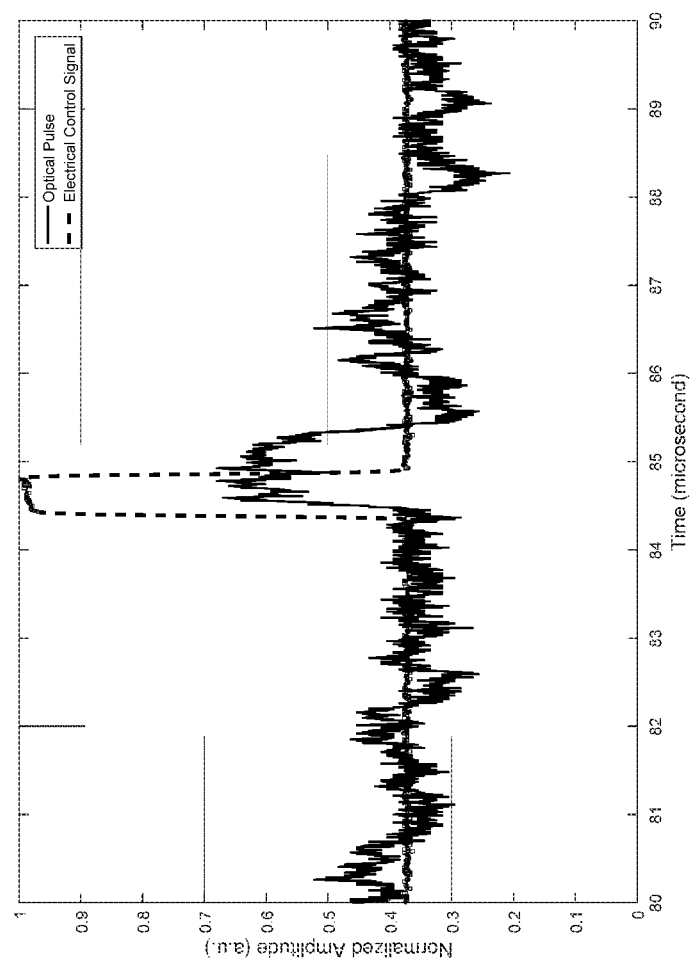
FIG. 8C—Graph illustrating an example of the optical pulses and square wave of the function generator overlapped in time.

The RF electrical signal generator 86 generates sinusoidal electrical signals at a repetition rate of 7 GHz. The sinusoidal signal in the first arm is amplified with >30 dB gain and transmitted to the first electro-optic phase modulator 11. The other arm enters the RF signal input of the digital phase shifter 88. The digital phase shifter 88, controlled by the function generator 89, allows the phase shift of RF electrical signals between 0° and 180° at 8-bit resolution. The phase shifter 88 is connected to another electrical signal amplifier with >30 dB gain 87 and a second electro-optic phase modulator 11, respectively. In the exemplary embodiment, the function generator 89 at a repetition rate of 10 kHz provides the phase switching from 0 to 180 between the sinusoidal electrical signals driving the first phase modulator 11 and the second phase modulator 11. Switching with the function generator 89 allows the generation of an optical pulse train with a repeat rate of ~10 kHz and a linewidth of <500 ns, as shown in FIG. 8B. FIG. 8C shows an example of the optical pulses and square wave of the function generator 89 overlapped in time for making a direct comparison.

Figure 9A:
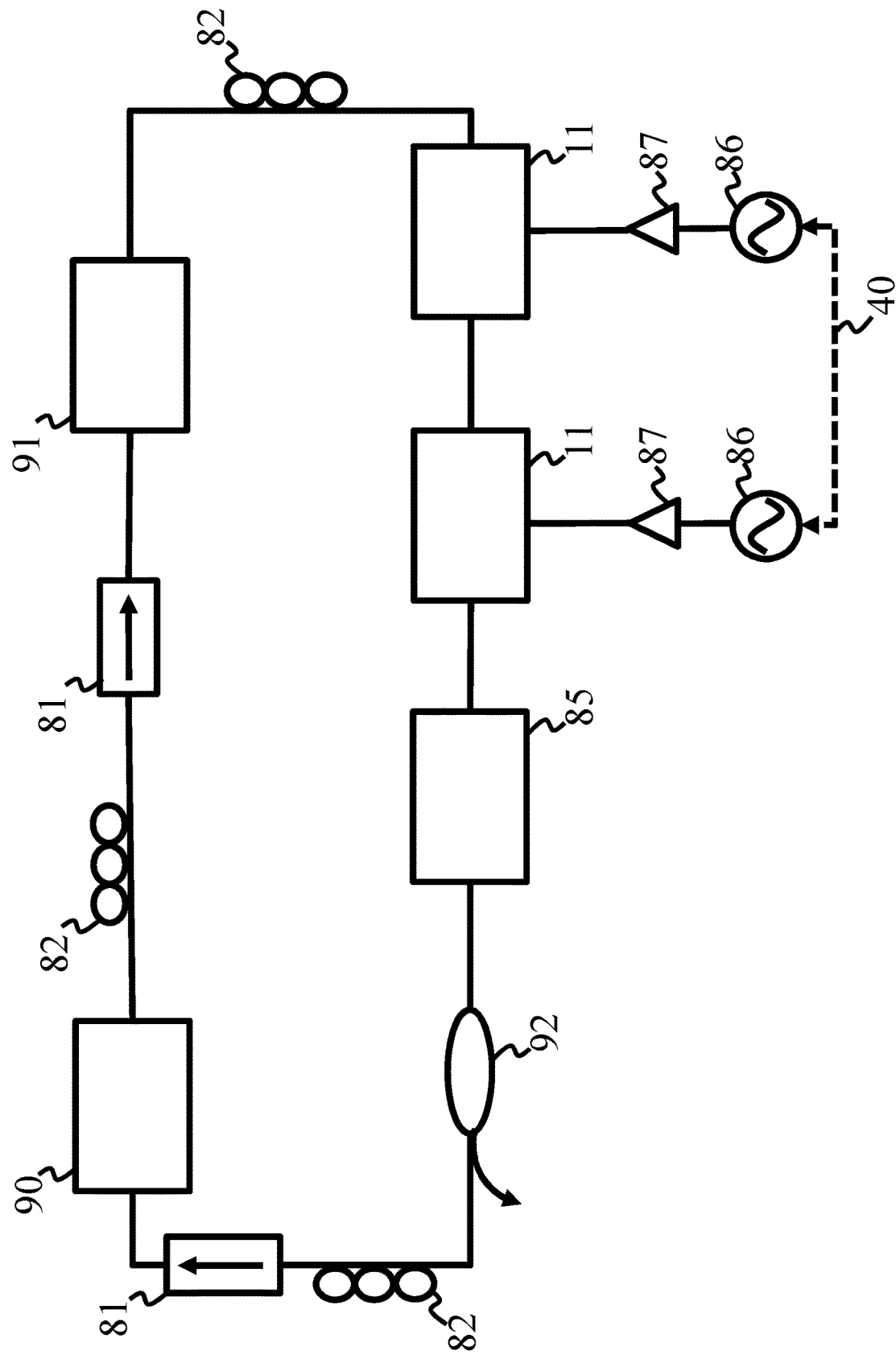
FIG. 9A: Block diagram illustrating a ring-cavity laser system using a signal arrangement associated with the configuration of FIG. 4.
Figure 9B:
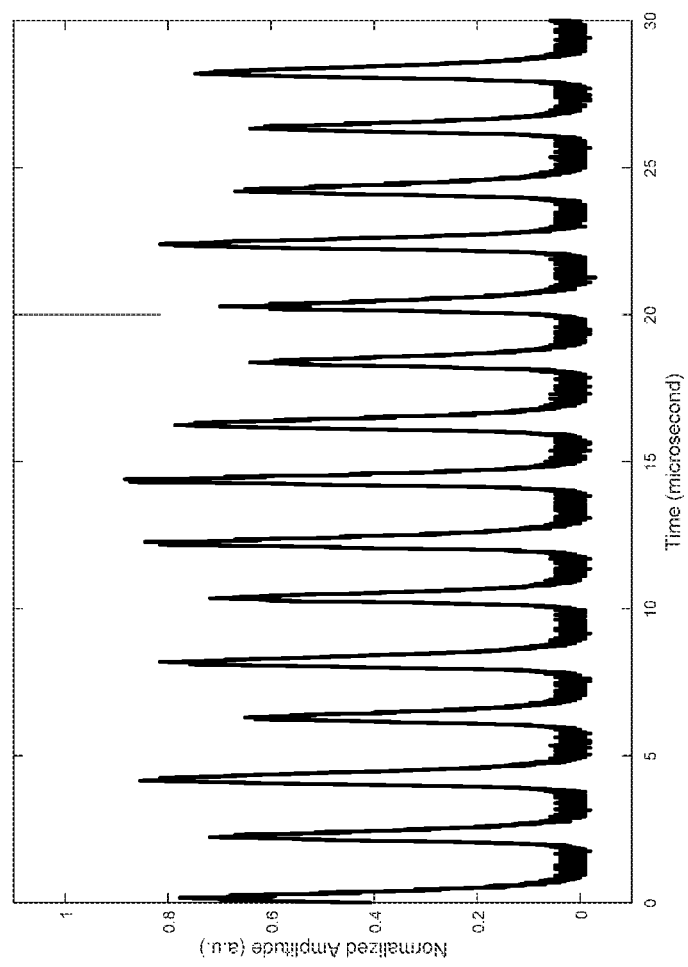
FIG. 9B: A Graph illustrating representative measured laser outputs of the exemplary ring-cavity laser in the time domain.

FIG. 9A shows a block diagram of an experimental ring laser, which exemplifies the actively mode-locked pulse generation implementation of the present invention. The system employs the arrangement of the electrical signal described in FIG. 4A. The system includes a semiconductor laser source 90 centered at 1289 nm, an optical insulator 81 to block the reflected beam, 1200 grooves/mm optical grating 91 for further narrowing the spectral width of light, 10-GHz $LiNbO_3$ electro-optic phase modulators 11, a fiber-based Fabry-Perot etalon filter with a fineness of 500 and 200 GHz free spectral range 85, polarization control pedals 82 to control the polarization state of the light, and a 90:10 output coupler 92. The RF signal generators 86 are phase-locked through 10 MHz clock input-output. >30 dB gain amplifiers 87 amplify and transmit 8 GHz sinusoidal signals to the electro-optic phase modulators 11. As shown in FIG. 9B, when setting the frequency difference between two signal generators 86 to 500 kHz (7.9995 GHz and 8 GHz), it is achieved to obtain an optical pulse train with a pulse width of <400 ns at 500 kHz (50% duty cycle).

All measurements of the optical results produced were obtained by an oscilloscope with a bandwidth of 3.5 GHz and a sampling rate of 40 GS/s combined with a photosensor with a bandwidth of 25 GHz.

CITATION LIST

Patent Literature

US20030063837A1, US20040253000A1, US20080114556A1, CA2397025A1, JPH06302881

Non-Patent Literature

1. R. Paschotta, "*Field Guide to Laser Pulse Generation*", SPIE Press, Washington USA, 2008.
2. A. E. Siegman, "*Lasers*", University Science Books, Palo Alto, California, Chapter 27-28, 1986.

3. B. E. A. Saleh and M. C. Teich, "*Fundamentals of Photonics*", John & Wiley Sons, Chapter 14, 1991.
4. H. Y. Ryu, H. S. Moon, and H. S. Suh, "*Optical frequency comb generator based on actively mode-locked fiber ring laser using an acousto-optic modulator with injection-seeding,*" Opt. Express 15, 11396-11401, 2007.
5. V. Torres-Company and A. M. Weiner, "*Optical frequency comb technology for ultra-broadband radio-frequency photonics*", Laser & Photonics Rev., 8(3), 368-393, 2014.
6. J. S. Wey, J. Goldhar, D. W. Rush, M. W. Chbat, G. M. Carter, and G. L. Burdge, "*Performance characterization of a harmonically mode-locked erbium fiber ring laser*", IEEE Photonics Tech. Lett., 7(2), 152-154, 1995.
7. J. J. Veselka and S. K. Korotky, "*Pulse generation for soliton systems using lithium niobate modulators*", IEEE J. of Selected Topics in Quantum Elect., 2(2), 300-310, 1996.
8. H. Tanaka, S. Takagi, M. Suzuki, and Y. Matsushima, "*Optical short pulse generating device*", U.S. Pat. No. 5,434,693, 1995.
9. T. Otsuji, M. Yaita, and T. Nagatsuma, and E. Sano, "*10-80-Gb/s highly extinctive electrooptic pulse pattern generator*", IEEE J. of Selected Topics in Quantum Elect. 2(3), 643-649, 1996.
10. T. Kobayashi, H. Yao, K. Amano, Y. Fukushima, A. Morimoto, and T. Sueta, "*Optical pulse compression using high-frequency electrooptic phase modulation*", IEEE J. of Quantum Elect., 24(2), 382-387, (1988).
11. T. Komukai, T. Yamamoto, and S. Kawanishi, "*Optical pulse generator using phase modulator and linearly chirped fiber Bragg gratings*", IEEE Photonics Tech. Lett., 17(8), 2005.
12. M. Wan, F. Li, X. Feng, X. Wang, Y. Cao, B. Guan, D. Huang, J. Yuan, and P. K. A. Wai, "*Time and Fourier domain jointly mode locked frequency comb swept fiber laser*", Optics Express, 25(26), 2017.
13. T. Kraetschmer, D. Dagel, and S. T. Sanders, "*Simple multiwavelength time-division multiplexed light source for sensing applications*", Optics Letters, 33(7), 738-740, 2008.
14. J. P. Kolb, T. Pfeiffer, M. Eibl, H. Hakert, and R. Huber R., "*High-resolution retinal swept source optical coherence tomography with an ultra-wideband Fourier-domain mode-locked laser at MHz A-scan rates*", Biomedical Optics Exp., 9(1), 2018.
15. G. P. Agrawal, "*Applications of Nonlinear Fiber Optics*", Academic Press, San Diego California, 241-249, 2001.
16. J. Hervas, D. Barrera, J. Madrigal, and S. Sales, "*Phase modulation to intensity modulation conversion for sensitive FBG sensor interrogation*", Proc. SPIE 10323, 1032342-1-1032342-4 (2017).

The invention claimed is:

1. A method for generating optical pulses with adjustable repetition rate and pulse-width and selection of the wavelength:
   for optical pulse generation wherein an in-line optical system or a ring-type laser cavity system comprising steps of:
   optical phase modulation of narrowband light for spectral broadening,
   optical phase modulation of the spectrally broadened light for further spectral re-broadening,
   optical phase demodulation of the spectrally broadened light in a short time for spectral re-narrowing, and
   optical filtering that passes only the spectrally broadened and then spectral narrowed light through a transmission line with high efficiency, >99%, for passive opening and closing function.

2. The method according to claim 1, wherein the optical phase modulation further comprises steps of:
   transmission of narrowband light to an electro-optic phase modulator,
   phase modulation of narrowband light with high amplitude, single frequency, or random frequency electrical signal,
   generation of side optical bands in multiples of the electrical signal frequency around the central optical frequency,
   spectrally broadening of the optical band, and
   determination of spectral broadening by the number of sidebands calculated from Bessel functions, modulation index, and frequency of electrical signals.

3. The method according to claim 1, wherein the optical phase demodulation further comprises steps of:
   transmission of spectrally broadened light to an electro-optic phase modulator,
   phase demodulation of spectrally broadened light with relatively opposite, high amplitude, single frequency or random frequency electrical signal, and
   spectrally narrowing of the optical band.

4. The method according to claim 2 or claim 3, wherein the electro-optic phase modulator comprises a $LiNbO_3$ optical phase modulator.

5. The method according to claim 2 or claim 3, wherein:
   a configuration includes two phase-locked electrical signal generators,
   a signal arrangement is provided by sinusoidal electrical signals with a slight frequency difference to drive electro-optic phase modulators,
   the frequency difference defines the repetition rate of an optical pulse train generated,
   twice the frequency difference defines the pulse width, full width at half max, of pulses in the optical pulse train.

6. The method according to claim 2 or claim 3, wherein:
   a configuration includes a signal generator, a square wave generator or a random bit generator, and a phase shifter,
   a signal arrangement with a phase-shift between electrical signals is provided to drive electro-optic phase modulators,
   the repetition rate of the square wave or bits driving the phase shifter defines the repetition rate of an optical pulse train generated, and
   the clock frequency of the square wave generator or the bit generator defines the pulse width of pulses in the optical pulse train.

7. The method according to claim 2 or claim 3, wherein:
   a configuration comprises a signal generator, a square wave generator or a random bit generator, and a frequency mixer,
   a signal arrangement with a phase-shift between electrical signals depending on the amplitude of the bits is provided to drive electro-optic phase modulators,
   the repetition rate of the square wave or bits driving the frequency mixer defines the repetition rate of an optical pulse train generated, and
   the clock frequency of the square wave generator or the bit generator defines the pulse width of pulses in the optical pulse train.

8. The method according to claim 2 or claim 3, wherein:
   a configuration comprises two phase-locked arbitrary waveform generators or a programmable bit pattern generator with two outputs, a signal arrangement with a random waveform that repeats over a predefined period and allows the insertion of controllable time delays between each other is provided to drive electro-optic phase modulators, the predefined period of the random waveforms defines the repetition rate of an optical pulse train generated, and the length of the random waveform in time defines the pulse width of pulses in the optical pulse train.

9. A system which performs the method according to claim 1, wherein the in-line optical setup comprising a narrowband light source, at least two electro-optic phase modulators connected in series, at least one electrical signal generator to drive the modulators, and one narrow linewidth optical filter.

10. The system of claim 5, wherein the narrowband light source comprises a high-power monolithic diode laser with an internal grating and a diode driver including an on-board TEC controller.

11. A system which performs the method according to claim 1, wherein the ring-type laser cavity comprising an optical frequency comb light source, at least two similarly featured electro-optic phase modulators, at least one electrical signal generator to drive the modulators, a narrow linewidth optical filter, and a coupler.

12. The system of claim 11, wherein the optical frequency comb light source comprises a high-power broadband semiconductor optical amplifier with an internal grating and a diode driver including an on-board TEC controller.

13. The system of claim 9 or claim 11, wherein the electrical signal generator comprises an RF-signal generator, a function generator, a random bit generator, a bit pattern generator, or a programmable bit pattern generator.

14. The system of claim 9, or claim 11, wherein the narrow linewidth optical filter comprises a fiber-based Fabry-Perot etalon.

* * * * *